(12) United States Patent
Remiat et al.

(10) Patent No.: US 8,815,108 B2
(45) Date of Patent: Aug. 26, 2014

(54) METHOD OF DEPOSITING LOCALIZED COATINGS

(75) Inventors: Bruno Remiat, Paris (FR); Laurent Vandroux, Le Cheylas (FR); Florent Souche, St Laurent du Pont (FR)

(73) Assignee: Commissariat a l'Energie Atomique, Paris (FR)

( * ) Notice: Subject to any disclaimer, the term of this patent is extended or adjusted under 35 U.S.C. 154(b) by 365 days.

(21) Appl. No.: 12/593,272

(22) PCT Filed: Apr. 3, 2008

(86) PCT No.: PCT/EP2008/054022
§ 371 (c)(1),
(2), (4) Date: Jun. 22, 2010

(87) PCT Pub. No.: WO2008/125511
PCT Pub. Date: Oct. 23, 2008

(65) Prior Publication Data
US 2010/0258524 A1    Oct. 14, 2010

(30) Foreign Application Priority Data

Apr. 3, 2007 (FR) ..................................... 07 54249

(51) Int. Cl.
C03C 15/00 (2006.01)
C03C 25/68 (2006.01)
H01L 21/302 (2006.01)
H01L 21/461 (2006.01)
H01L 21/311 (2006.01)

(52) U.S. Cl.
USPC ................... 216/83; 216/90; 216/91; 216/95; 438/689; 438/745; 438/753; 438/754

(58) Field of Classification Search
None
See application file for complete search history.

(56) References Cited

U.S. PATENT DOCUMENTS

| 4,597,160 A * | 7/1986 | Ipri ................................ 438/166 |
| 4,614,564 A * | 9/1986 | Sheldon et al. ................ 438/492 |
| 5,554,488 A | 9/1996 | Rioux |
| 2001/0044181 A1* | 11/2001 | Nakamura ..................... 438/253 |
| 2002/0009881 A1* | 1/2002 | Ezura ............................ 438/658 |

FOREIGN PATENT DOCUMENTS

| GB | 2059679 A | 4/1981 |
| JP | 56-50517 | 5/1981 |
| JP | 61-67918 | 4/1986 |
| JP | 61-135115 | 6/1986 |

(Continued)

OTHER PUBLICATIONS

International Search Report for PCT/EP2008/054022 dated Jul. 3, 2008.

(Continued)

*Primary Examiner* — Nadine Norton
*Assistant Examiner* — Stephanie Duclair
(74) *Attorney, Agent, or Firm* — Nixon Peabody LLP

(57) ABSTRACT

A method of depositing a non-continuous coating of a first material on a substrate, comprising: a) the formation of a mask on this substrate, by forming at least two mask layers, and etching of at least one cavity in these layers, this cavity having an outline such that a coating, deposited on the substrate, through the cavities of the mask, has at least one discontinuity over said outline of the cavity; b) the deposition of the first material on the substrate, through the cavities of the mask, the coating thus deposited having at least one discontinuity over the outline of said cavity; and c) the mask is removed.

22 Claims, 4 Drawing Sheets

(56) References Cited

FOREIGN PATENT DOCUMENTS

| JP | 10-510953 | 10/1998 |
| JP | 2000-77336 | 3/2000 |
| JP | 2002-25935 | 1/2002 |

OTHER PUBLICATIONS

International Preliminary Report on Patentability for PCT/EP2008/054022 dated Dec. 3, 2009.
French Preliminary Search Report for FR 07-54249 dated Dec. 7, 2007.

* cited by examiner

METHOD OF DEPOSITING LOCALIZED COATINGS

CROSS REFERENCE TO RELATED APPLICATIONS OR PRIORITY CLAIM

This application is a national phase of International Application No. PCT/EP2008/054022, entitled "METHOD OF DEPOSITING LOCALIZED COATINGS", which was filed on Apr. 3, 2008, and which claims priority of French Patent Application No. 07 54249, filed Apr. 3, 2007.

DESCRIPTION

Technical Field and Prior Art

The invention relates to the field of coating techniques, in particular by PECVD, evaporation or cathodic sputtering. It makes it possible to localise a coating deposited by one of these techniques.

The invention especially applies to the production of photovoltaic cells, in particular the production of n-type or p-type electrodes.

More generally, it is suited to the formation of patterns having, for example, a width of around a millimetre, separated from each other by a width of around a millimetre, or less.

The techniques commonly used in microelectronics, or in the field of semi-conductors, such as photolithography, cannot be used to deposit localised coatings, in a simple manner at reasonable cost. Indeed, these techniques require the deposition of a continuous or full wafer coating then the removal, by etching, of the unnecessary zones. These techniques are slow and costly.

The techniques that make it possible to deposit localised coatings, other than those used in microelectronics, are, essentially:

electrolytic coating techniques, which are too expensive, techniques that make use of a mechanical masking: but a metal mask can perturb a plasma used during the coating, whereas a mask made of another material, for example polymer, does not have the required level of stability, imprinting techniques: they are suitable for emulsions, but not for other materials.

The problem is thus posed of depositing localised coatings, in a simpler and cheaper manner than known techniques.

DESCRIPTION OF THE INVENTION

According to the invention a mask, known as deposition mask, is formed in an assembly of n layers, n being preferably equal to 1, 2 or 3, lying on a substrate and defining openings or cavities, on this substrate, in or on which a localised deposition of a material has to be carried out.

For this purpose, the cavities have a a profile section such that, during the deposition operation, parts of these cavities are not covered with the material to be deposited, thereby forming discontinuities, and a removal of the mask is possible from these non-covered zones or these discontinuities.

The formation of these non-covered zones or these discontinuities in fact makes it possible to remove the mask easily, by chemical attack using the discontinuities as favoured path.

The deposition mask may for example be formed by means of a resin or polymer paste mask. The latter is formed for example by serigraphy. It makes it possible to define in the stack of n layers zones to be etched to form the cavities through which the substrate can be reached.

Thanks to the deposition mask, it is then possible to localise a deposition of a material, which is carried out by a technique such as, for example, PECVD, evaporation or cathodic sputtering.

The object of the invention is thus in particular a method of depositing a non-continuous coating of a first material on a substrate, comprising:

a) the formation of a mask on this substrate, by forming at least two mask layers, an upper layer and a lower layer, the nearest to the substrate, and etching of at least one cavity in these layers, this cavity having a profile such that a coating, deposited on the substrate, through the cavities of the mask, has at least one discontinuity over said profile of the cavity, b) the deposition of the first material on the substrate, through the cavities of the mask, the coating thus deposited having at least one discontinuity over the profile section of said cavity, and c) the mask is removed.

The formation of cavities may comprise a prior localised coating, over said two mask layers, of a layer of a polymer paste or resin, in the etching zones of said two mask layers. The polymer or resin layer is removed, or not, before step b). The thickness of the polymer paste or resin coating ranges for example between 300 nm and 10 µm.

The etching at least of the layer the nearest to the substrate is preferably a non-anisotropic etching, for example an isotropic etching.

The two layers preferably have etching rates different to one another. For example, the upper layer is more resistant to an etching chemistry (dry or wet) than the lower layer. The upper layer may also then be etched by an etching chemistry different to that then used to etch the lower layer of the bilayer. These two layers have for example a thickness ranging between 100 nm and 2000 nm.

The first material, to be deposited on the substrate, is for example made of SiN, or a-Si:H, or a-SiN:H, or a-SiOx, or a-SiC:H, or a-SiON:H, or a-SiOC:H.

This first material may also be a metal, such as aluminium, or ITO, or gold, or an alloy of metals or of these metals. Il may also be amorphous silicon.

In the case of amorphous silicon, said amorphous silicon may be surface oxidised after coating step b).

The etching of step a) preferably makes it possible to obtain rounded sides at least in the lower layer. Again, preferably, it makes it possible to obtain an etching of the upper layer so as to form an overhang above the zone etched in the lower layer. This overhang has for example a length at least equal to the thickness of the lower layer.

As for step c), it may be carried out by chemical etching of the mask forming layers, through the zones of first material forming discontinuities.

DETAILED DESCRIPTION OF SPECIFIC EMBODIMENTS

Figure 1A:
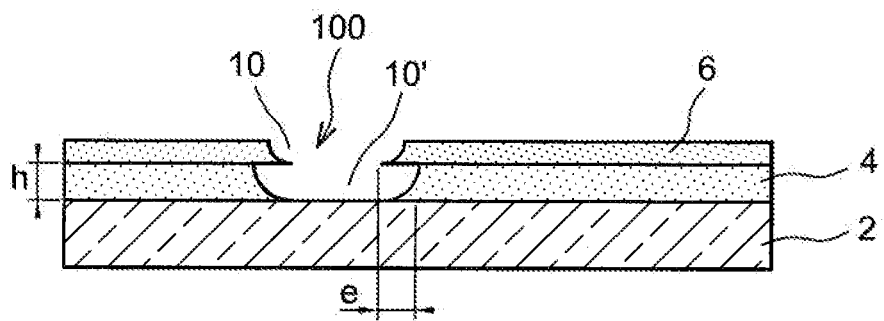
FIGS. 1A and 1B represent steps of an embodiment of a method according to the invention, with a two layer mask.

As illustrated in FIG. 1A, the invention makes it possible to deposit a deposition mask, constituted in this figure of an assembly of two superimposed layers 4,6, known as bilayer. This mask has cavities 100 that make it possible to define zones, on the substrate 2, on which a coating can then be deposited. A single cavity is represented here, but any number (two or more) could be provided.

Figure 1B:
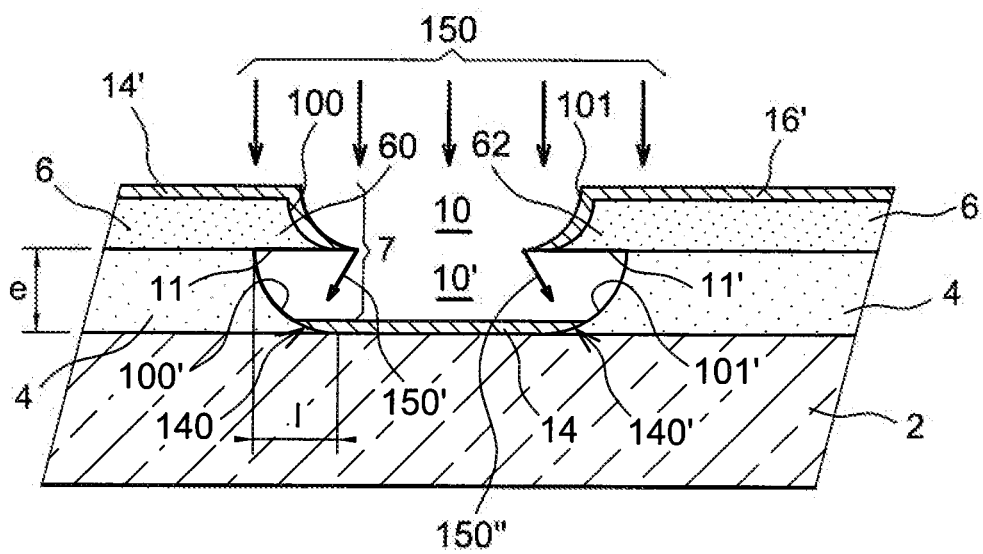
Figure 2:
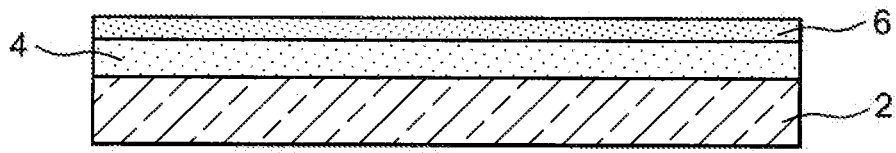
FIGS. 2 to 8 represent steps of an embodiment of a method according to the invention.
Figure 3:
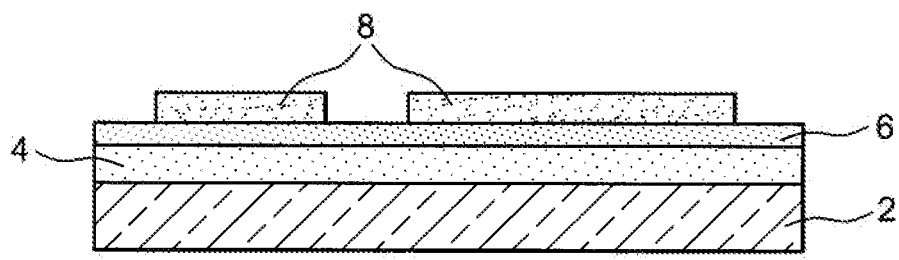

FIG. 1B represents an enlarged cavity 100. It is formed in the bilayer and has a lateral profile 7 such that, during a deposition 150 of material to be deposited, portions 11, 11' of this outline will remain devoid of this deposit.

Thus, it may be seen in FIG. 1B that a deposit 14, 14', 16' is carried out at the bottom of a cavity 100, as well as on the upper face of the layer 6 (this deposit is referenced 14',16'), whereas the deposit does not reach the zones 11, 11', formed by an extension or an overhang 60, 62 of the layer 6, and delimiting a cavity 10 formed in this layer 6, above the cavity 10' etched in the layer 4.

Each of the lower zones 11, 11' of the overhangs or extensions of the layer 6 has a lateral extension or a length l. It is possible to determine, by simple tests, especially as a function of the thickness of material to be deposited locally, the length l making it possible to obtain a discontinuous deposit (in other words an absence of deposit in a part at least of the zones 11, 11').

In the example represented in these figures, the two layers 6 then 4 have been successively etched, to obtain a cavity 10, 10' in each layer. A non-anisotropic etching makes it possible to form cavities 10, 10' with rounded sides 100, 101, 100', 101' and an overhang 60, 62 of the upper layer 6 above the cavity 10' formed in the layer 4.

The cavities 100 have an effect of "focusing" the material during its deposition 150. However, effects due to the edges of these openings can occur. For instance, references 150', 150" designate, in FIG. 1B, flows of material to be deposited, which, on account of the overhangs 60, 62, are going to be directed laterally to form the lateral zones 140, 140' of the deposit 14 at the bottom of the cavity 100. These lateral zones do not reach the lower faces 11, 11' of the overhangs 60, 62, lower faces that are turned towards the cavity 10'.

Other steps of an embodiment of the invention will now be described with reference to FIGS. 2 to 8.

In a first step (FIG. 2), on a substrate 2 (said substrate is for example made of semi-conductor material (especially silicon for photovoltaic applications), or glass, or stainless steel, or any other material that will be compatible with subsequent chemical treatments) is carried out a coating of a stacking 4, 6 by CVD (PECVD or thermal CVD or SACVD (Sub-Atmospheric Chemical Vapour Deposition), the latter being a vapour phase chemical deposition technique at a pressure close to atmospheric pressure) or by "spin" technique ("spin coating"); techniques such as laminating or by spray may also be used.

The layer 4 of the stacking the nearest to the substrate 2 is intended to be etched either selectively compared to the layer 6 of the stacking (in other words with an etching technique that only affects the layer 4 and not, or hardly, the layer 6), or with a much faster etching rate than the layer 6, in order to obtain the overhangs 60, 62.

Thus, it is possible for example to form, in particular with a view to a subsequent attack with an HF solution of around 5 to 10%:

a layer 6 of silicon nitride SiN over a layer 4 of silicon oxide, or a layer 6 of silicon oxide $SiO_x$ over a layer 4 also of silicon oxide $SiO_y$ (where $y<x\leq 2$), or a layer 6 of silicon oxide over a layer 4 of FSG; FSG is a silicon oxide containing fluorine (up to several % of F). It may be deposited by chemical vapour deposition (CVD) or by centrifugation. FSG is more sensitive to an HF attack than silicon oxide: it is thus etched more quickly, or a layer 6 of silicon nitride SiN over a layer 4 of FSG, or a layer 6 of silicon nitride SiN over a layer 4 of SOG; SOG is the abbreviation for spin-on glass, which is a silicon oxide deposited by centrifugation (spin coating), or a layer 6 of SOG (SOG1) over a layer 4 of SOG (SOG2); SOG1 and SOG2 designate two different SOG materials deposited by centrifugation: they have different compositions and/or different densities and/or different annealing temperatures. The rates of attack by HF of these two materials are thus different to each other, or a layer 6 of organic dielectric material (for example: BCB), over a layer 4 of silicon oxide, etc.

Thus, the upper layer 6 is chosen so as to be more resistant to an etching chemistry than the lower layer 4 (which signifies that the rate of etching of the material of layer 6 is lower than the rate of etching of the material of layer 4). There may even be a total etching selectivity between the first and second layer: a different etching chemistry to that used for layer 6 is then used to etch the sub-layer 4 and transfer the pattern onto it.

The selectivity is defined by the ratio between the etching rates between the upper layer 6 and that of the lower layer 4.

This selectivity exists especially for the pairs $SiN/SiO_x$, SiN/FSG and $SiO_x$/FSG (in these pairs, the first material mentioned is the material of layer 6, the second is the material of layer 4), compared to an HF attack.

For the bilayer $SiO_x/SiO_y$, ($y<x\leq 2$), the PECVD deposition parameters may be adapted in order to reduce the HF resistance of the lower layer 4, or the lower part of the single layer (a layer of higher density being more resistant to the HF etching).

An a-Ge type sub-layer 4, which is attacked selectively by a solution containing $H_2O_2$, may also be used. The layer 6 is then for example made of silicon dioxide, selectively attacked by HF.

The thickness of the bilayer 4, 6 may range for example between 100 nm and 2000 nm. This thickness makes it possible to guarantee or assure a correct efficiency of the localised deposition method. This thickness is preferably to be adapted as a function of the thickness of the layer 14 to be localised later.

A coating of a polymer paste or resin 8 is then carried out (FIG. 3) by serigraphy and annealing if necessary. A polymer based paste resistant to acid or a HF paste or a polymer or oxide based paste, such as oxide glass, may be taken for example. All of these pastes are commercially available. A paste having the characteristic of resisting, after annealing, the attacks of acids and dissolving in bases may for example be used. Other pastes having variable characteristics exist. Resins (of similar type to that of lithography resins) may also be used. More generally, any material that can be deposited locally and which resists the chemistry employed subsequently may be used, for example an organic dielectric such as BCB.

The thicknesses of the paste or resin coating 8 may range from several hundreds of nm, for example 300 nm or 500 nm, to several microns, for example 5 μm or 10 μm. During tests carried out, the thickness of polymer paste deposited ranged between around 5 μm and 10 μm but lower thicknesses may be envisaged.

The deposition of paste or resin 8 by serigraphy leaves openings 18 that make it possible to reach the upper layer of the bilayer 4, 6.

Figure 4:
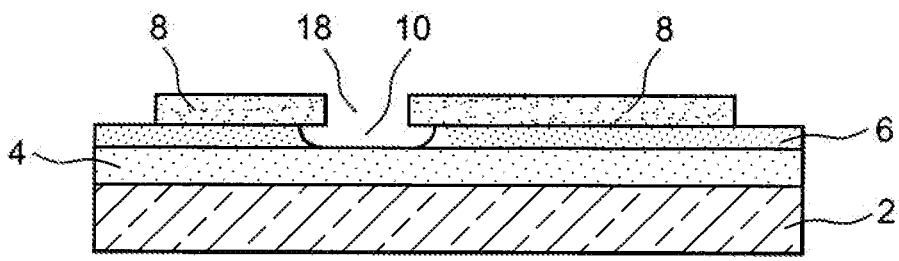
Figure 5:
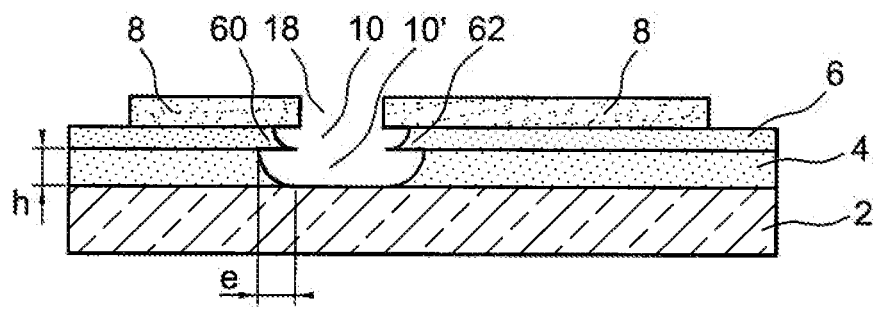
Figure 6:
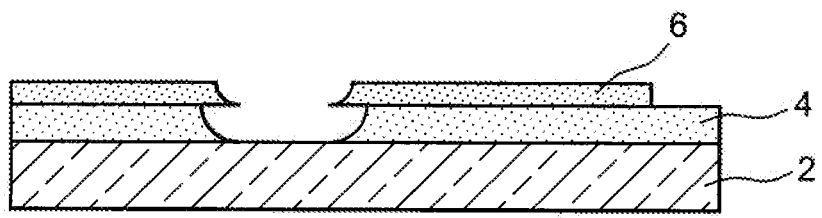
Figure 7A:
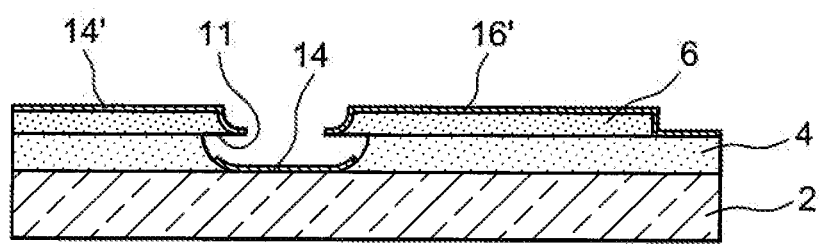
Figure 7B:
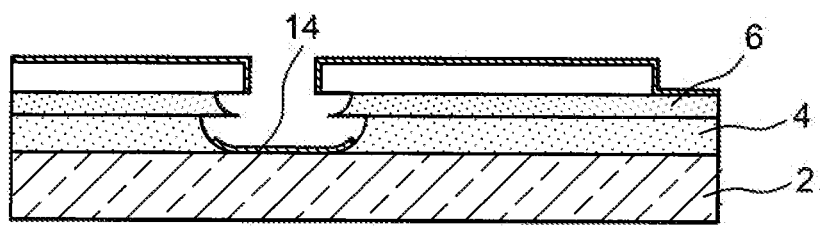
Figure 8:
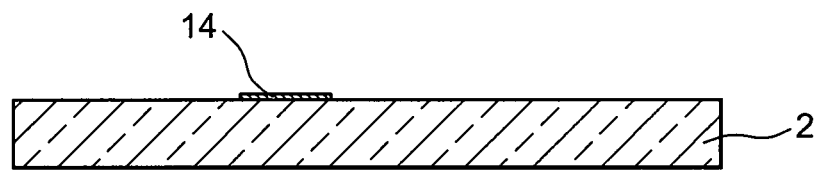

An etching of the bilayer 4, 6 is then carried out (FIG. 4) from zones 18 defined by the serigraphy: the difference in etching rates between the two layers 4, 6 makes it possible to obtain the requisite overhang pattern, for example that represented in FIG. 5 (and in a more detailed manner in FIG. 1B), with "rounded" sides, the concavity of which is turned towards the openings 18. For the etching of the bilayer, a single chemistry or two different chemistries are used depending on the chosen stacking In the case of HF etching, a solution diluted to 5% may be used. This etching is optimised for each stacking and as a function of the etching selectivity: the attack time may for example be reduced (the more concentrated the HF, the shorter the attack time) while avoiding degrading the sub-layers (in the case of a more concentrated HF solution—of around 30% to 49%—observations have made it possible to demonstrate the formation of holes in some sub-layers, for example a-Si:H).

Advantageously, in the case of a wet type etching (isotropic), rounded sides (as illustrated in FIG. 4 and following figures) are obtained in the etching layers 4, 6, the etching in depth is accompanied by a lateral etching, the concavity of which is turned towards the openings 10, 12.

Each layer is etched and, as illustrated in FIGS. 5 and 1B, a portion 60, 62 of the upper layer 6 remains above each cavity 10', 12' etched in the layer 4 (see also the detailed structure of FIG. 1B). This portion will make it possible, as already explained above with reference to FIG. 1B, to form a zone 11, 11' on which no deposition will take place subsequently. In other words, a deposition will take place at the bottom of the cavity, on the upper surface of the layer 6, partially on the sides of the cavity 10', but not on some lateral portions of these cavities and not on the lower surfaces 11, 11' of the overhangs 60, 62. It is through these zones not comprising any deposit that an attack with a view to removing the mask (layers 4, 6) can then take place efficiently.

Then, there is removal of the polymer paste or the resin 8 (FIG. 6): a water/ethanol mixture may for example be used for this removal.

As an alternative, this polymer paste 8 may be conserved if it is compatible with the future steps; indeed, the polymer paste 8 is stable up to 150-200° C. and, when the deposit 14, 16 is not carried out under vacuum, there is no risk of degassing. If the polymer paste 8 is conserved the structure remains, for the following steps, that of FIG. 4.

The preceding steps have enabled a deposition mask to be formed. The deposition of the layer 14 to be localised is then carried out (FIGS. 7A and 7B): the presence of the etching profile obtained by the preceding steps (the profile with the overhang 60, 62) enables a non-continuous deposit to be obtained: the walls of the cavities formed in the bilayer 4, 6 are not completely covered by the new material 14 deposited. In both cases, whether the paste 8 has been removed, or not, a coating 140, 160 of the material to be deposited also takes place on the upper surfaces of the bilayer or the paste layer 8. On the other hand, as explained above, the profile obtained in the bilayer, and especially the overhang, enables a part of the cavity not to be covered with material to be deposited. A discontinuity is thereby created in the deposit of this material, discontinuity that will make it possible to attack easily the bilayer with a view to its removal.

By way of example, it is possible to deposit, as material 14, dielectric materials deposited by thermal CVD or plasma assisted CVD or centrifugation (a-SiN:H, or a-SiOx, or a-SiC:H, or a-SiON:H, or a-SiOC:H, etc.); metals or metal alloys may also be deposited by cathodic sputtering or evaporation (for example: Al, or ITO, or Au or others). This material 14 is compatible with a subsequent etching of the layer 4 and is not removed during this etching.

The thickness of this layer 14 is preferably chosen to facilitate the delamination of the mask, in other words its removal. The maximum thickness that can be deposited, without preventing the delamination, varies according to the nature of the material 14 and the thickness of the bilayer 4, 6 or the mask.

For example, a 5 nm layer 14 of a-Si:H is correctly localised by attacking by a 5% HF solution at 20° C. a bilayer 4, 6 of 200 nm of $SiO_2$, each layer of the bilayer having a different stoichiometry (leading to different etching rates for the two layers, faster for the layer 4). The use of a bilayer 4, 6 facilitates the delamination (by the creation of the overhang, as explained above) and thus allows a higher thickness of a-Si:H from the mask of 200 nm thickness. The delamination is less satisfactory with the following stacking: 50 nm of a-Si:H (=layer 14) over 100 nm of $SiO_2$ (layers 4 and 6).

After formation of the discontinuous coating, there is then (FIG. 8) delamination or disbonding of the bilayer or the polymer paste/bilayer stacking, by chemical attack (for example HF attack in the case of a sub-layer of silicon oxide; $H_2O_2$ attack in the case of germanium, or $H_3PO_4$ in the case of nitride SiN): the non-continuity of the deposited layer 14 enables the chemical attack of the bilayer 4, 6. In particular, the layer 6/layer 4 interface, in the vicinity of which no material has been deposited during the deposition 150, will make it possible to form a channel for introducing the chemical attack liquid.

An embodiment example for a $SiN/SiO_2$ bilayer is given below:

the bilayer comprises a layer of SiN, of 20 nm thickness, deposited by PECVD at 180° C. (layer 6) and a layer of $SiO_2$, of 500 nm thickness, deposited by PECVD at 180° C. (layer 4), the layer 14 to be localised is made of amorphous silicon (a-Si:H), of 10 nm thickness, and it is deposited by PECVD, the solution used to etch the bilayer 4,5 is HF (5%) at 20° C.

As an alterative, in particular in the case of the deposition of a layer 14 of amorphous silicon, it may be worthwhile carrying out an $O_3$ treatment. This treatment makes it possible to surface oxidise this layer 14 of a-Si:H but also any lateral parts 140, 140' of this layer (see FIG. 10).

The surface of the amorphous material thus oxidised will be etched by HF during the step of removal of the mask 4, 6. A surface of better quality is thereby obtained, with fewer defects and not having been exposed to the polymer 8 removal treatment.

Figure 9:
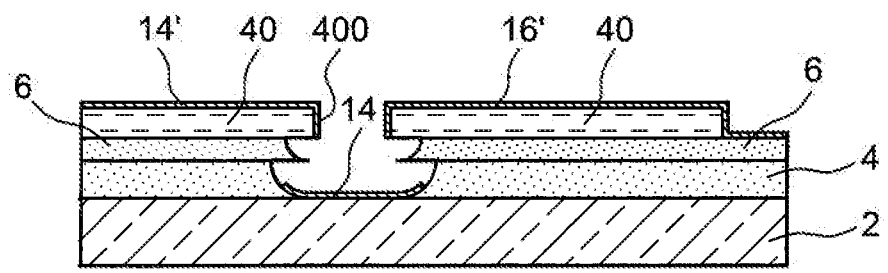
FIG. 9 represents an embodiment of a method according to the invention, with a three layer mask.
Figure 10:
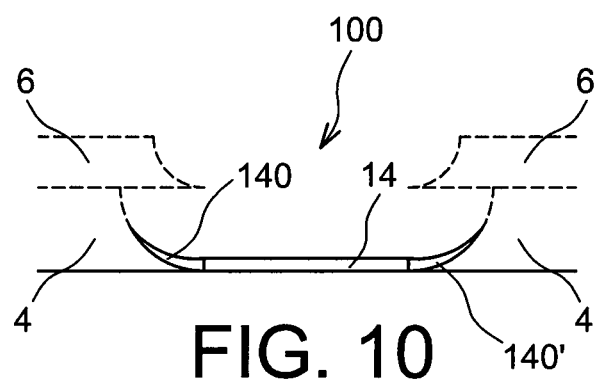
FIG. 10 represents lateral residual coatings after removal of a mask.

Moreover, in the case of an amorphous silicon deposit 14, carrying out an oxidation makes it possible to remove any lateral residues, on either side of each localised coating: this problem is illustrated in FIG. 10, in which is shown the deposit 14, and the walls of the layer 4, removed by chemical etching. It may be seen in this figure that lateral residues 140' of deposited silicon remain, even after removal of the layer 4. If an oxidation of the silicon has taken place, for a sufficient time to completely or almost completely oxidise the lateral portions 14', 16', but insufficient to oxidise the deposits 14, 16 deposited at the bottom of the cavities 100, 120 other than in a superficial manner, said lateral portions could be removed with the layers 4, 6 or 9 (case of a single layer, FIG. 9).

The invention has been explained by means of examples in which the mask comprised two layers. It is also possible to use a third layer, preferably having a total selectivity for the chemical etchings used for the under-lying layers; in other words, this third layer is preferably not attacked laterally during these chemical etching steps. FIG. 9 represents the same step as that illustrated in FIG. 7B (identical numerical references designate identical or similar parts), but with a third layer designated by the reference 40. It may be seen in this figure that the two layers 4, 6 have been etched, but that the layer 40 is intact, except for the openings 400, 402, which reproduce those formed beforehand in the polymer or resin layer (not represented in the figure). All of the above considerations, relative to the etching of the two underlying layers 4, 6, the nature of the various materials composing the layer(s) forming the mask, as well as the nature of the material to be deposited, remain valid. In particular, the coating carried out will be discontinuous, and this discontinuity will then enable the mask to be removed.

The invention claimed is:

1. Method of depositing a non-continuous coating of a first material on a substrate, comprising:
    forming a mask on the substrate, wherein forming the mask comprises:
        forming at least two mask layers, wherein the at least two mask layers comprises an upper layer and a lower layer; and
        etching at least one cavity in the at least two mask layers, the at least one cavity having a profile such that a deposit deposited on the substrate through the cavities of the mask has at least one discontinuity over the profile of the cavity;
    depositing the first material on the substrate through the at least one cavity of the mask, wherein the first material comprises amorphous silicon, wherein the first material is deposited to form a coating having at least one discontinuity over the profile of the at least one cavity;
    oxidizing the amorphous silicon, the oxidizing of the amorphous silicon taking place for a time that makes it possible to oxidize completely or almost completely lateral portions of the amorphous silicon deposited at the bottom of the at least one cavity without oxidizing the deposits of amorphous silicon deposited at the bottom of the at least one cavity other than in a superficial manner; and
    removing the mask, thereby eliminating said lateral portions of the amorphous silicon.

2. Method according to claim 1, the formation of cavities comprising a prior localised coating, on said two mask layers, of a polymer paste or resin layer, delimiting, between the coating zones, etching zones of said two mask layers.

3. Method according to claim 2, in which the polymer or resin layer is removed before step b).

4. Method according to claim 2, in which the polymer or resin layer is not removed before step b).

5. Method according to claim 1, the etching at least of the layer the nearest to the substrate being a non-anisotropic etching.

6. Method according to claim 1, the two superimposed layers having etching rates different to each other.

7. Method according to claim 1, the two superimposed layers having a total thickness ranging between 100 nm and 2000 nm.

8. Method according to claim 1, the upper layer being more resistant to an etching chemistry than the lower layer.

9. Method according to claim 1, the upper layer being etched by an etching chemistry different to that then used to etch the lower layer.

10. Method according to claim 1, the two superimposed layers comprising:
    a layer of silicon nitride SiN over a layer of silicon oxide,
    or a layer of silicon oxide $SiO_x$ over a layer also of silicon oxide $SiO_y$ (where $x \neq y$),
    or a layer of silicon oxide over a layer of FSG,
    or a layer of SiN over a layer of FSG,
    or a layer of silicon nitride SiN over a layer of FSG,
    or a layer of silicon nitride SiN over a layer of SOG,
    or a layer of SOG (SOG1) over a layer of SOG (SOG2),
    or a layer of an organic dielectric BCB over a layer of silicon oxide.

11. Method according to claim 1, the formation of the mask comprising the formation of an additional layer over the two mask layers.

12. Method according to claim 11, the additional layer not being attacked laterally during the step of etching the cavity.

13. Method according to claim 1, the etching of the lower layer, and if necessary the upper layer, being of HF chemical type.

14. Method according to claim 1, coating step b) being carried out by PECVD, or by evaporation or cathodic sputtering.

15. Method according to claim 1, the etching of step a) making it possible to obtain rounded sides at least in the lower layer.

16. Method according to claim 1, the etching of step a) making it possible to obtain an etching of the upper layer so as to form an overhang above the zone etched in the lower layer.

17. Method according to claim 1, step c) being carried out by chemical etching of the mask forming layers, through zones of first material forming discontinuities.

18. Method according to claim 1, oxidizing the amorphous silicon being carried out by an $O_3$ treatment.

19. Method of depositing a non-continuous coating of a first material on a substrate, comprising:
    forming a mask on the substrate, wherein forming the mask comprises:
        forming at least two mask layers, wherein the at least two mask layers comprises an upper layer and a lower layer; and
        etching at least one cavity in the at least two mask layers, the at least one cavity having a profile such that a deposit deposited on the substrate through the cavities of the mask has at least one discontinuity over the profile of the cavity, said etching making it possible to obtain rounded sides at least in the lower layer;
    depositing the first material on the substrate through the at least one cavity of the mask, wherein the first material comprises amorphous silicon, wherein the first material is deposited to form a coating having at least one discontinuity over the profile of the at least one cavity;
    oxidizing the amorphous silicon, the oxidizing of the amorphous silicon taking place for a time that makes it possible to oxidize completely or almost completely lateral portions of the amorphous silicon deposited at the bottom of the at least one cavity without oxidizing the deposits of amorphous silicon deposited at the bottom of the at least one cavity other than in a superficial manner; and
    removing the mask, thereby eliminating said lateral portions of the amorphous silicon.

20. Method according to claim 19, the etching of step a) making it possible to obtain rounded sides of each of said at least two mask layers.

21. Method according to claim 19, the cavity having an opening, said rounded sides having a concavity which is turned towards said opening.

22. Method of making a photovoltaic cell comprising forming a non-continuous coating of a first material on a substrate, comprising:

forming a mask on the substrate, wherein forming the mask comprises:
  forming at least two mask layers, wherein the at least two mask layers comprises an upper layer and a lower layer; and
  etching at least one cavity in the at least two mask layers, the at least one cavity having a profile such that a deposit deposited on the substrate through the cavities of the mask has at least one discontinuity over the profile of the cavity, said etching making it possible to obtain rounded sides at least in the lower layer;
depositing the first material on the substrate through the at least one cavity of the mask, wherein the first material comprises amorphous silicon, wherein the first material is deposited to form a coating having at least one discontinuity over the profile of the at least one cavity;
oxidizing the amorphous silicon, the oxidizing of the amorphous silicon taking place for a time that makes it possible to oxidize completely or almost completely lateral portions of the amorphous silicon deposited at the bottom of the at least one cavity without oxidizing the deposits of amorphous silicon deposited at the bottom of the at least one cavity other than a superficial manner; and
removing the mask, thereby eliminating said lateral portions of the amorphous silicon, and leaving a non-continuous coating of said first material on said substrate.

\* \* \* \* \*